(12) United States Patent
Cao et al.

(10) Patent No.: US 9,147,582 B2
(45) Date of Patent: Sep. 29, 2015

(54) MANUFACTURING METHODS FOR SEMICONDUCTOR DEVICES

(75) Inventors: Jinbo Cao, Rexford, NY (US); Bastiaan Arie Korevaar, Schenectady, NY (US); George Theodore Dalakos, Niskayuna, NY (US); Aharon Yakimov, Niskayuna, NY (US); Scott D. Feldman-Peabody, Golden, CO (US); Dalong Zhong, Niskayuna, NY (US); Juan Carlos Rojo, Niskayuna, NY (US)

(73) Assignee: First Solar, Inc., Tempe, AZ (US)

( * ) Notice: Subject to any disclaimer, the term of this patent is extended or adjusted under 35 U.S.C. 154(b) by 798 days.

(21) Appl. No.: 13/329,418

(22) Filed: Dec. 19, 2011

(65) Prior Publication Data
US 2013/0157405 A1 Jun. 20, 2013

(51) Int. Cl.
*H01L 31/0296* (2006.01)
*H01L 21/477* (2006.01)
*H01L 31/18* (2006.01)
*H01L 31/0392* (2006.01)

(52) U.S. Cl.
CPC ........ *H01L 21/477* (2013.01); *H01L 31/03925* (2013.01); *H01L 31/1828* (2013.01); *H01L 31/1864* (2013.01); *Y02E 10/543* (2013.01)

(58) Field of Classification Search
None
See application file for complete search history.

(56) References Cited

U.S. PATENT DOCUMENTS

| | | | |
|---|---|---|---|
| 4,708,883 A | 11/1987 | Hovel et al. | |
| 4,709,466 A | 12/1987 | McCandless et al. | |
| 4,830,987 A | 5/1989 | Miller et al. | |
| 5,578,502 A | 11/1996 | Albright et al. | |
| 6,344,608 B2 | 2/2002 | Kariya et al. | |
| 7,939,363 B1 | 5/2011 | Johnson et al. | |
| 7,943,415 B1 | 5/2011 | Gossman et al. | |
| 8,044,508 B2 | 10/2011 | Jenson et al. | |
| 8,809,105 B2 * | 8/2014 | Cao et al. ........................ | 438/86 |
| 2011/0143490 A1 | 6/2011 | O'Keefe | |
| 2011/0265865 A1 | 11/2011 | Korevaar | |
| 2011/0265874 A1 | 11/2011 | Gossman et al. | |

FOREIGN PATENT DOCUMENTS

EP   0174010 A2   3/1986

OTHER PUBLICATIONS

Search Report and Written Opinion from corresponding PCT Application No. PCT/US2012/069660 dated Apr. 23, 2013.
Pande et al., "A Simplified Capless Annealing of GaAs for MESFET Applications", IEEE Transactions on Electron Devices, IEEE Service Center, Piscataway, NJ, US, vol. 31, No. 4, pp. 506-508, Apr. 1, 1984.

(Continued)

*Primary Examiner* — Seahvosh Nikmanesh
(74) *Attorney, Agent, or Firm* — MacMillan, Sobanski & Todd, LLC

(57) ABSTRACT

A method of manufacturing semiconductor assemblies is provided. The manufacturing method includes thermally processing a first semiconductor assembly comprising a first semiconductor layer disposed on a first support and thermally processing a second semiconductor assembly comprising a second semiconductor layer disposed on a second support. The first and second semiconductor assemblies are thermally processed simultaneously, and the first and second semiconductor assemblies are arranged such that the first semiconductor layer faces the second semiconductor layer during the thermal processing.

27 Claims, 6 Drawing Sheets

(56) References Cited

OTHER PUBLICATIONS

Armiento et al., "Capless Rapid Thermal Annealing of GaAs Implanted With Si Using an Enhanced Overpressure Proximity Method", Journal of the Electrochemical Society, Electrochemical Society, Manchester, New Hampshire; US, vol. 134, No. 8A, pp. 2010-2016, Aug. 1, 1987.

Wong et al., "Defect Suppression and Enhancement of Minority Carrier Lifetimes Inbulk GaAs", Solar Cells, Elsevier Sequoia.S.A. Lausanne, CH, vol. 27, No. 1-04, pp. 419-427, Oct. 1, 1989.

Wong et al., "Reduction of bulk and surface recombination in GaAs for improved solar cell performance", IEEE Electron Device Letters, IEEE Service Center, New York, NY, US, vol. 11, No. 7, pp. 321-323, Jul. 1, 1990.

Schink et al., "Sub-micron self-aligned-gate HEMT for microwave applications", Solid State Electronics, Elsevier Science Publishers, Barking, GB, vol. 34, No. 11, pp. 1247-1250, Nov. 1, 1991.

Seth et al., "Growth and characterization of CdTe by close spaced sublimation on metal substrates", Solar Energy Materials and Solar Cells, Elsevier Science Publishers, Amsterdam, NL, vol. 59, No. 1-2, pp. 35-49, Sep. 1, 1999.

Wu et al., "High-efficiency polycrystalline CdTe thin-film solar cells with an oxygenated amorphous cds (a-CdS:O) window layer", Conference Record of the IEEE Photovoltaic Specialists Conference 2002 Institute of Electrical and Electronics Engineers Inc. US; [IEEE Photovoltaic Specialists Conference], Conference Record of the 29th IEEE Photovoltaic Specialists Conference—200, vol. CONF. 29, pp. 531-534, May 19, 2002.

Wu, "High-efficiency polycrystalline CdTe thin-film solar cells", Solar Energy, Pergamon Press. Oxford, GB, vol. 77, No. 6, pp. 803-814, Dec. 1, 2004.

Ghosh et al., "Controlling the electrical property of highly transparent conducting film of Zn coated Al doped ZnO by mechano-chemical pathway of face-to-face annealing", Chemical Physics Letters, Elsevier BV, NL, vol. 528, pp. 68-71, Jan. 12, 2012.

Ariienzo et al., "Single-crystal Solar Cell Heterojunctions Involving N—cadmium Sulfide", J. of Applied Physics, vol. 51, Issue 6, Jun. 1980, pp. 3393-3403.

Wu et al., "A Novel Manufacturing Process For Fabricating Cds/CdTe Polycrystalline Thin-film Solar Cells", Presented at the 16th European Photovoltaic Solar Energy Conference and Exhibition, Glasgow, Scotlane, UK, May 1-5, 2000.

Peng et al., "Methods of Making a Transparent Layer and A Photovoltaic Device", U.S. Appl. No. 13/284,037, filed Oct. 28, 2011.

* cited by examiner

MANUFACTURING METHODS FOR SEMICONDUCTOR DEVICES

BACKGROUND

The invention relates generally to methods for annealing semiconductor layers and, more particularly, to methods for annealing semiconductor layers for the manufacture of photovoltaic (PV) devices.

PV (or solar) cells are used for converting solar energy into electrical energy. Thin film PV devices may include a number of semiconductor layers disposed on a transparent support, where one semiconductor layer serves as a window layer, and a second semiconductor layer serves as an absorber layer. Solar radiation travels through the window layer to the absorber layer, where the optical energy is converted to usable electrical energy. Additional layers are often employed to enhance the conversion efficiency of the PV device.

There are a variety of candidate material systems for PV cells, each of which has certain advantages and disadvantages. Cadmium telluride/cadmium sulfide (CdTe/CdS) hetero-junction-based photovoltaic cells are one such example of thin film solar cells.

Thin film solar cell manufacturing typically requires a significant number of processing steps to form multiple layers on a substrate. Because of the large number of processing steps, layers, and interfaces, thin film solar cells can be expensive and time consuming to manufacture. Researchers are continually striving to improve the efficiency and reduce the production costs of the thin film PV cells.

A typical polycrystalline thin film PV cell has a very thin (typically less than 0.12 micron) layer called the "window" layer. The window layer's role is to form a heterojunction in combination with an absorber layer. The window layer desirably is thin enough and has a wide enough bandgap (2.4 eV or more) to transmit most available light through to the absorber layer. For copper indium gallium selenide (CIGS) and CdTe type solar cells, the most common material for the window layer is cadmium sulfide (CdS), which is a direct bandgap semiconductor. Various methods may be used to deposit CdS thin films, for example chemical bath deposition, sol-gel, electrochemical deposition, thermal evaporation, sputtering, and spraying.

CIGS and CdTe photovoltaic devices can suffer reduced performance due to the loss of photons at window layer and/or poor charge collection at the p-n junction. Thus, it would be desirable to increase the light transmission of the window layer and/or improve the junction performance by improving the quality of the window layer.

BRIEF DESCRIPTION

One aspect of the present invention resides in a method of manufacturing semiconductor assemblies. The manufacturing method includes thermally processing a first semiconductor assembly comprising a first semiconductor layer disposed on a first support and thermally processing a second semiconductor assembly comprising a second semiconductor layer disposed on a second support. The first and second semiconductor assemblies are thermally processed simultaneously, and the first and second semiconductor assemblies are arranged such that the first semiconductor layer faces the second semiconductor layer during the thermal processing.

DRAWINGS

These and other features, aspects, and advantages of the present invention will become better understood when the following detailed description is read with reference to the accompanying drawings in which like characters represent like parts throughout the drawings, wherein:

FIG. 1 schematically depicts, in cross-sectional view, first and second semiconductor assemblies in an adjacent face-to-face arrangement for thermal processing, according to aspects of the present invention;

FIG. 2 schematically depicts, in cross-sectional view, first and second semiconductor assemblies separated by a gap using spacers, in a face-to-face arrangement for thermal processing, according to aspects of the present invention;

FIG. 3 schematically depicts, in cross-sectional view, a semiconductor assembly with a cadmium tin oxide layer disposed between the semiconductor layer and the support;

FIG. 4 schematically depicts, in cross-sectional view, a semiconductor assembly with a conductive layer disposed between the cadmium tin oxide layer and the semiconductor layer of FIG. 3;

FIG. 5 schematically depicts, in cross-sectional view, a semiconductor assembly with a resistive, transparent buffer layer disposed between the conductive layer and the semiconductor layer of FIG. 4;

FIG. 6 schematically depicts, in cross-sectional view, a semiconductor assembly with a barrier layer disposed between the cadmium tin oxide layer and the semiconductor layer of FIGS. 4-6;

FIG. 7 schematically depicts, in cross-sectional view, first and second semiconductor assemblies with the configuration shown in FIG. 6, in an adjacent face-to-face arrangement for thermal processing, according to aspects of the present invention;

FIG. 8 schematically depicts, in cross-sectional view, an example photovoltaic device with the window layer configuration shown in FIG. 6;

DETAILED DESCRIPTION

Figure 1:
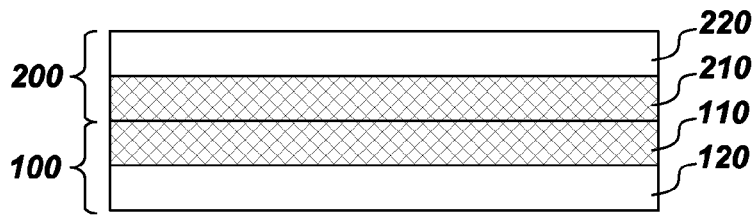

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The modifier "about" used in connection with a quantity is inclusive of the stated value, and has the meaning dictated by context, (e.g., includes the degree of error associated with measurement of the particular quantity). In addition, the term "combination" is inclusive of blends, mixtures, alloys, reaction products, and the like.

Moreover, in this specification, the suffix "(s)" is usually intended to include both the singular and the plural of the term that it modifies, thereby including one or more of that term.

Reference throughout the specification to "one embodiment," or "another embodiment," "an embodiment," and so forth, means that a particular element (e.g., feature, structure, and/or characteristic) described in connection with the embodiment is included in at least one embodiment described herein, and may or may not be present in other embodiments. Similarly, reference to "a particular configuration" means that a particular element (e.g., feature, structure, and/or characteristic) described in connection with the configuration is included in at least one configuration described herein, and may or may not be present in other configurations. In addition, it is to be understood that the described inventive features may be combined in any suitable manner in the various embodiments and configurations.

In addition, approximating language, as used herein throughout the specification and claims, may be applied to modify any quantitative representation that could permissibly vary without resulting in a change in the basic function to which it is related. Accordingly, a value modified by a term or terms, such as "about", is not limited to the precise value specified. In some instances, the approximating language may correspond to the precision of an instrument for measuring the value.

Further, the terms "transparent region", "transparent layer" and "transparent electrode" as used herein, refer to a region, a layer, or an article that allows an average transmission of at least 80% of incident electromagnetic radiation having a wavelength in a range from about 300 nm to about 850 nm. As used herein, the term "disposed on" refers to layers disposed directly in contact with each other or indirectly by having intervening layers there between.

A method of manufacturing a number of semiconductor assemblies 100, 200 is described with reference to FIGS. 1-8. The manufacturing method includes thermally processing a first semiconductor assembly 100 comprising a first semiconductor layer 110 disposed on a first support 120 and thermally processing a second semiconductor assembly 200 comprising a second semiconductor layer 210 disposed on a second support 220. As indicated, for example in FIGS. 1 and 2, the first and second semiconductor assemblies 100, 200 are thermally processed simultaneously, and the first and second semiconductor assemblies 100, 200 are arranged such that the first semiconductor layer 110 faces the second semiconductor layer 210 during the thermal processing. As used here, the term "faces" should be understood to include layers disposed adjacent to (directly in contact with) each other or alternatively separated from one another, for example, separated with a spacer disposed between the two layers.

For particular configurations, the first and the second semiconductor layers 110, 210 comprise a material selected from the group consisting of cadmium sulfide (CdS), indium (III) sulfide ($In_2S_3$), zinc sulfide (ZnS), zinc telluride (ZnTe), zinc selenide (ZnSe), cadmium selenide (CdSe), cadmium manganese selenide ($Cd_xMn_{1-x}Se$), oxygenated cadmium sulfide (CdS:O), copper oxide ($Cu_2O$), amorphous or micro-crystalline silicon and Zn(O,H), CdO, Cd(O,H) and combinations thereof. These materials should also be understood to include the alloys thereof. For particular configurations, the first and the second semiconductor layers 110, 210 may comprise a metal-selenide or a metal-sulfide. For more particular configurations, the first and the second semiconductor layers 110, 210 may comprise cadmium sulfide (CdS) or oxygenated cadmium sulfide (CdS:O). For particular processes, the first and the second semiconductor layers 110, 210 may comprise oxygenated cadmium sulfide (CdS:O) with an oxygen content in a range of about two atomic percent (2%) to about twenty five atomic percent (25%). It bears noting that the above-mentioned semiconductor materials may be used alone or in combination. Further, these materials may be present in more than one layer, each layer having different type of material or having combinations of the materials in separate layers.

For particular arrangements, the thermally processed semiconductor layers 110, 210 may serve as the junction-forming layer for a photovoltaic device. For particular configurations, the semiconductor layers 110, 210 may comprise CdS and have thicknesses in a range of about 50-100 nm. The atomic percent of cadmium in the cadmium sulfide, for certain configurations, may be in a range of about 45-55 atomic percent, and more particularly, in a range of about 48-52 atomic percent.

The manufacturing method may further optionally include the steps of disposing the first semiconductor layer 110 on the first support 120 and disposing the second semiconductor layer 210 on the second support 220, where the first and second semiconductor layers 110, 210 are disposed prior to performing the thermal processing. As noted above, the term "disposed on" refers to layers disposed directly in contact with each other or indirectly by having intervening layers there between. For particular processes, the first and the second semiconductor layers 110, 210 may be disposed using a low substrate temperature deposition technique. As used here, "substrate" should be understood to mean the supports 120, 220. The semiconductor layers may be deposited, for example, at room temperature. Example low temperature deposition techniques include, without limitation, sputtering, evaporation, atomic layer deposition (ALD), chemical bath deposition (CBD), and electrochemical deposition (ECD). For other processes, the layers may be deposited at relatively higher temperatures using techniques, such as chemical vapor deposition (CVD) or close-space sublimation (CSS). In some embodiments, sputtering may also be used with a high temperature substrate.

The supports 120, 220 may be transparent over the range of wavelengths for which transmission through the respective support 120, 220 is desired. For particular configurations, the supports 120, 220 may be transparent to visible light having a wavelength in a range of about 400-1000 nm. The material for the supports 120, 220 may be selected such that the thermal expansion coefficient of the support 120, 220 is close to the thermal expansion coefficient of the adjacent layer (for example, the transparent, conductive layer 130, 230 in FIG. 3) to prevent cracking or buckling of the adjacent layer during heat treatments. For certain configurations, the supports 120, 220 may comprise a material capable of withstanding heat treatment temperatures greater than about 600° C., such as, for example silica and borosilicate glass.

For the example configuration shown in FIG. 1, the first and second semiconductor assemblies 100, 200 are arranged such that the first and the second semiconductor layers 110, 210 are adjacent during the thermal processing. For example, the first and second semiconductor assemblies 100, 200 may be clamped together or the upper assembly (200 in FIG. 1) may be weighted down to maintain the two semiconductor layers 110, 210 in contact during the thermal processing. For these "adjacent" configurations, the manufacturing method may further include purging the opposing surfaces of the first and second semiconductor layers 110, 210 before assembling the two assemblies 100, 200 for the thermal processing. For example, the purging may include flowing a high purity inert gas across the opposing surfaces of the first and second semiconductor layers 110, 210, prior to placing the two semiconductor layers in contact. Without being bound by any theory, it is believed that purging of the first and second semiconductor layers 110, 210 may remove residual oxygen or moisture absorbed on the opposing surfaces of the semiconductor layers.

Figure 2:
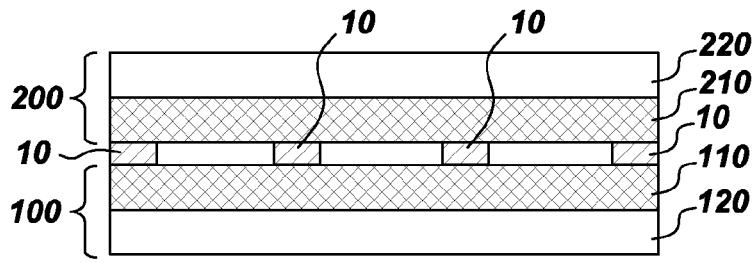

For the example configuration shown in FIG. 2, the first and second semiconductor assemblies 100, 200 are arranged such that the first and the second semiconductor layers 110, 210 are spaced apart from one another during the thermal processing. For particular configurations, the first and the second semiconductor layers 110, 210 comprise a material (for example, CdS:O), and the thermal processing is performed with an overpressure of vapor phase of the material, of the constituents of the material, or combinations thereof. It should also be noted, that for certain embodiments, only one assembly may be thermally processed with an overpressure of vapor phase of the material, of the constituents of the material, or combinations thereof. This direct annealing configuration is not expressly shown. That is, the assembly may be directly (namely, not in a face-to-face arrangement) thermally processed with an overpressure of vapor phase of the material. For certain processes, the spacing between the first and the second semiconductor layers 110, 210 may vary by position. For example, for certain manufacturing processes, the assemblies may have relative large areas (for example, on the order of 1 m$^2$) but be relatively thin (on the order of 1 mm), so any gap between the first and the second semiconductor layers 110, 210 will be likely to vary absent specific engineering solutions to maintain a consistent gap across the entire area of the semiconductor layers 110, 210.

More particularly, the first and second semiconductor layers 110, 210 may be spaced apart from one another by a maximum distance of about 6 mm during the thermal processing. For particular configurations, the first and second semiconductor layers 110, 210 may be spaced apart from one another by less than or equal to about 2 mm, and more particularly by less than or equal to about 1.2 mm, and still more particularly, by less than or equal to about 0.7 mm during the thermal processing. For the example configuration shown in FIG. 2, the manufacturing method further includes disposing at least one spacer 10 between the first and the second semiconductor layers 110, 210, such that the first and the second semiconductor layers 110, 210 are spaced apart from one another during the thermal processing. Generally speaking, any suitable spacer having the required structural characteristics capable of withstanding the thermal processing conditions (as described later) may be used for separating the first assembly 100 and the second assembly 200 and for maintaining a desired gap between the two assemblies. However, for particular configurations, the spacer(s) 10 comprises a particulate material disposed on at least a portion of the first semiconductor layer 110, on at least a portion of the second semiconductor later 210, or on at least a portion of both the first and the second semiconductor layers 110, 210.

For particular processes, the particulate material may be disposed by mechanical spreading, vibrational mechanical spreading, electrostatic spraying, vapor transport deposition, or combinations thereof. The particulate material may have a variety of shapes and cross-sectional geometries, for example, spheres, rods, tubes, flakes, fibers, plates, wires, cubes, blocks, or whiskers. Example cross-sectional geometries for the particulate material include one or more of circular, ellipsoidal, triangular, rectangular, and polygonal. For particular configurations, the particulate material may comprise spherical or non-spherical particles and may be regular or irregular in shape.

Generally, the particulate material may have a suitable thickness and shape depending in part on one or more of the particulate material chemistry, the deposition conditions, and the gap desired between the two assemblies. For particular configurations, the particulate material may have an average thickness in a range from about 0.10 millimeters to about 6 millimeters. The term "thickness" as used herein refers to refers to a dimension of the spacer between the first semiconductor layer 110 and the second semiconductor layer 210, and may refer to a diameter of the spacer or height of the spacer, depending on the specific geometry for the spacer(s).

For particular configurations, the first and the second semiconductor layers 110, 210 may comprise a metallic elemental constituent, and the particulate material comprises the same metallic elemental constituent. For example, the metallic elemental constituent may comprise cadmium. More particularly, the particulate material may further comprise a reducing agent. The term 'reducing agent' as used herein refers to a material capable of bringing about reduction, by depletion of oxygen or addition of hydrogen, in other materials by being itself oxidized in a chemical reaction. For particular configurations, the reducing agent may comprise sulfur. For example, the first and the second semiconductor layers 110, 210 may comprise CdS, and the particulate material for the spacer(s) 10 may also comprise CdS. For particular processes, the particulate material may comprise cadmium sulfide powder.

For particular configurations, the particulate material may form a substantially discontinuous layer of cadmium sulfide on the first semiconductor layer 110, on the second semiconductor layer, or on both. Namely, the particulate material would not be coextensive with the semiconductor layers 110, 120. Without being bound by any theory, the particulate material may advantageously provide for a rough surface and thus help to prevent the first assembly 100 and the second assembly 200 from sticking to each other and provide for ease of separation of the two assemblies after thermal processing, particularly in the case when thermal processing in a vacuum.

As noted above, the first and second semiconductor assemblies 100, 200 are thermally processed simultaneously, in a face-to-face arrangement. For particular processes, the assemblies 100, 200 are thermal processed simultaneously by heating the assemblies 100, 200 at a treatment temperature, under vacuum conditions, and for a duration sufficient to achieve the desired electrical and optical properties for the thermally processed semiconductor layers. The composition, thickness, morphology, electrical properties, and optical properties of one or both the semiconductor layers 110, 210 may be advantageously controlled by varying one or more of treatment temperature, duration of heat treatment, and vacuum conditions employed during heat treatment.

For particular processes, the thermal processing comprises heating the first and second semiconductor layers 110, 210 at temperatures in a range of about 500° C. to about 700° C. and, more particularly, in a range of about 550° C. to about 660° C. In one non-limiting example, CdS layers disposed on borosilicate glass were heated at a temperature of about 630° C. for about 15 minutes. As will be recognized by those skilled in the art, the upper limit of the annealing temperature may depend in part on the type of glass used for the supports 120, 220.

For particular processes, the thermal processing comprises heating the first and second semiconductor layers 110, 210 for about 1-60 minutes, and more particularly, for about 10-40 minutes. The time duration for the thermal processing (annealing) refers to the time for which the semiconductor layers 110, 210 are subjected to the annealing temperature in the annealing furnace. The time duration for annealing does not include the initial ramping period during which the semiconductor layers 110, 210 are ramped to the annealing temperature.

The thermal annealing process may further be controlled by varying the pressure conditions employed during thermal processing. For certain processes, the thermal annealing may be carried out under vacuum conditions, defined herein as pressure conditions below atmospheric pressure. For certain processes, the thermal processing may be carried out in the presence of an inert gas, such as argon or nitrogen at a constant pressure. For certain processes, the thermal processing may be carried out under dynamic pressure by pumping and flowing gas. Without being bound to any particular theory, for certain processes, higher pressures may be desirable to prevent sublimation of material from the substrate. In other processes, lower pressures may be desirable to better remove impurity gasses. "Pressure conditions" as used herein refer to the actual (static or dynamic) pressure of the sample during the annealing process.

As noted above, the simultaneous thermal processing of the assemblies 100, 200 anneals the semiconductor layers 110, 210. Thus, certain embodiments of the methods of the present invention advantageously provide for higher throughputs and reduced manufacturing costs by annealing two semiconductor layers using one thermal processing step. Beneficially, by thermally processing CdS layers 110, 210 in a face-to-face arrangement, the vapor pressure of CdS can be maintained near the surface of the two CdS films 110, 210, and thus the CdS sublimation can be reduced. Thus, the above face-to-face thermal processing facilitates processing CdS films 110, 210 at higher temperatures. Desirably, the relatively high-temperature annealing may better recrystallize CdS films 110, 210, modify their grain structures, and enhance the optical transmission of the window layers. In addition and without being bound by a particular theory, it is believed that the higher crystallinity (as discussed below with reference to FIG. 9) of the resulting CdS films 110, 210 have may provide better nucleation sites for subsequently deposited CdTe absorber layer growth. Consequently, higher efficiency PV cells, with higher short circuit current, higher open circuit voltage, and higher fill factor may be obtained by means of the thermal processing of the CdS window layers 110, 210, as discussed below with reference to FIGS. 10-14.

Referring now to FIGS. 3-7, the manufacturing method may further optionally include disposing at least one intermediate layer 130, 140, 150, 160 on the first support 120 prior to disposing the first semiconductor layer 110, such that the intermediate layer(s) 130, 140, 150, 160 is (are) disposed between the first support 120 and the first semiconductor layer 110. Similarly, the manufacturing method may further optionally include disposing at least one intermediate layer 230, 240, 250, 260 on the second support 220 prior to disposing the second semiconductor layer 210, such that the at least one intermediate layer 230, 240, 250, 260 is disposed between the second support 220 and the second semiconductor layer 210. For particular configurations, the manufacturing method optionally includes disposing intermediate layers on the first and second supports prior to disposing the first and second semiconductor layers, respectively.

Figure 3:
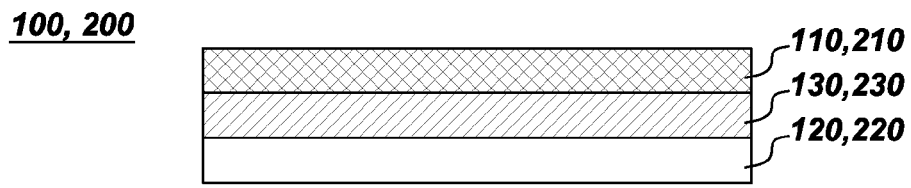

For the example configuration shown in FIG. 3, transparent conductive layers 130, 230 are disposed between the respective semiconductor layer and support. For example, the transparent conductive layer 130, 230 may comprise a transparent conductive material, for example a transparent conductive oxide, such as cadmium tin oxide (CTO), indium tin oxide (ITO) or fluorinated tin oxide (FTO). It should be noted that the initially deposited transparent conductive layers 130, 230 may be opaque and non-conductive prior to thermal processing, depending on the specific material used. For example, CTO requires annealing. The initially deposited cadmium tin oxide layer is typically non-conductive, semi-transparent and amorphous. After crystallization from thermal processing, the CTO becomes electrically conductive, and optically more transparent. Although FTO does not generally require annealing, FTO can withstand an anneal. ITO may benefit from annealing, depending on prior processing. Further, the transparent conductive layers 130, 230 may be disposed directly on the respective supports, as indicated in FIG. 3, or one or more intervening layers may be disposed between the transparent conductive layers 130, 230 and the respective supports, as discussed below with reference to FIGS. 6-8.

For particular configurations, the transparent conductive layers 130, 230 comprise CTO. As used herein, the term "cadmium tin oxide" refers to a composition of cadmium, tin, and oxygen. For certain configurations, the cadmium tin oxide may comprise a stoichiometric composition of cadmium and tin, where, for example, the atomic ratio of cadmium to tin is about 2:1. For other configurations, the cadmium tin oxide may comprise a non-stoichiometric composition of cadmium and tin, where, for example, the atomic ratio of cadmium to tin is in range less than about 2:1 or greater than about 2:1. As used herein, the terms "cadmium tin oxide" and "CTO" may be used interchangeably. The cadmium tin oxide may further include one or more dopants, such as, for example, copper, zinc, calcium, yttrium, zirconium, hafnium, vanadium, tin, ruthenium, magnesium, indium, zinc, palladium, rhodium, titanium, or combinations thereof. "Substantially amorphous cadmium tin oxide" as used herein refers to a cadmium tin oxide layer that does not have a distinct crystalline pattern as observed by X-ray diffraction (XRD). CTO layers 130, 230 will typically be deposited as a substantially amorphous CTO layer, as discussed below.

The cadmium tin oxide may function as a transparent conductive oxide (TCO). The use of cadmium tin oxide as a TCO has numerous advantages including superior electrical, optical, surface, and mechanical properties and increased stability at elevated temperatures when compared to tin oxide, indium oxide, indium tin oxide, and other transparent conductive oxides. The electrical properties of cadmium tin oxide may depend in part on the composition of cadmium tin oxide characterized in some embodiments by the atomic concentration of cadmium and tin, or alternatively in some other embodiments by the atomic ratio of cadmium to tin in cadmium tin oxide. The atomic ratio of cadmium to tin, as used herein, refers to the ratio of the atomic concentration of cadmium to tin in cadmium tin oxide. Atomic concentrations of cadmium and tin and the corresponding atomic ratio are commonly measured using, for instance, x-ray photoelectron spectroscopy (XPS). For particular configurations, the atomic ratio of cadmium to tin in the CTO layers 130, 230 is in a range from about 1.2:1 to about 3:1, and more particularly, in a range from about 1.5:1 to about 2.5:1, and still more particularly, in a range from about 1.7:1 to about 2.15:1. For particular configurations, the atomic ratio of cadmium to tin in the CTO layers 130, 230 is in a range from about 1.4:1 to about 2:1.

For particular configurations, the atomic concentration of cadmium in the CTO layers 130, 230 may be in a range of about 20-40% of the total atomic content of the CTO, and more particularly, in a range of about 25-35% of the total atomic content of the CTO, and still more particularly, about 28-32% of the total atomic content of the CTO. For particular configurations, the atomic concentration of tin in the CTO layers 130, 230 may be in a range of about 10-30% of the total atomic content of the CTO, and more particularly, in a range of about 15-28% of the total atomic content of the CTO, and still more particularly, in a range of about 18-24% of the total atomic content of the CTO. For particular configurations, the atomic concentration of oxygen in the CTO layers 130, 230 may be in a range of about 30-70% of the total atomic content of the CTO, and more particularly, in a range of about 40-60% of the total atomic content of the CTO, and still more particularly, in a range of about 44-50% of the total atomic content of the CTO.

The CTO layers 130, 230 may be disposed on the respective supports 120, 220 by any suitable technique, such as sputtering (for example, radio frequency (RF) sputtering, direct current (DC) sputtering, or reactive sputtering in the presence of oxygen), chemical vapor deposition, spin coating, spray coating, or dip coating.

Figure 4:
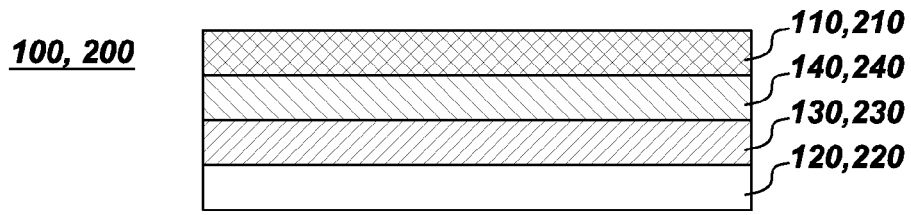
Figure 5:
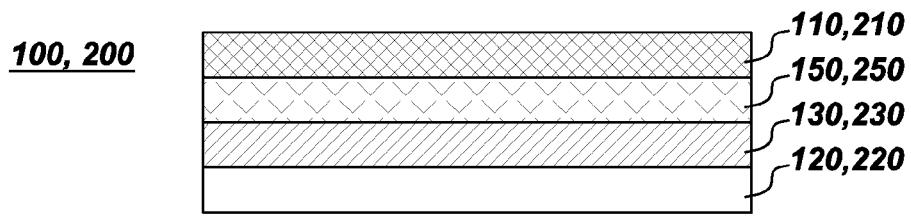
Figure 7:
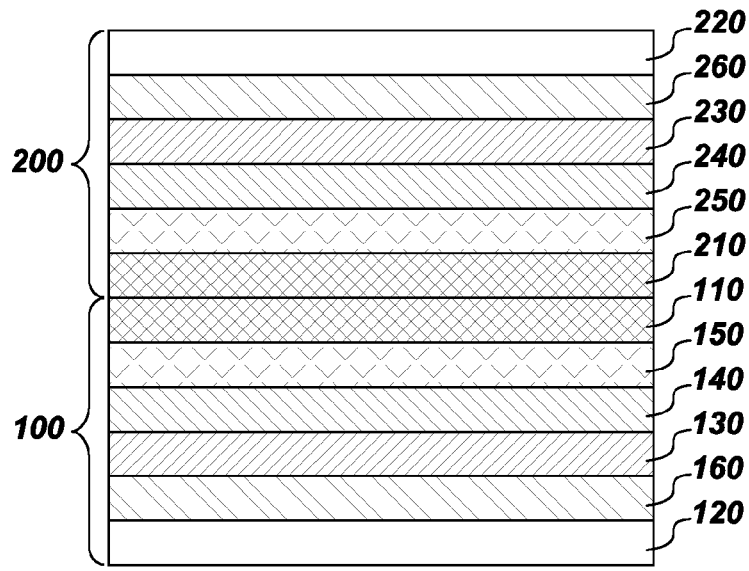
Figure 8:
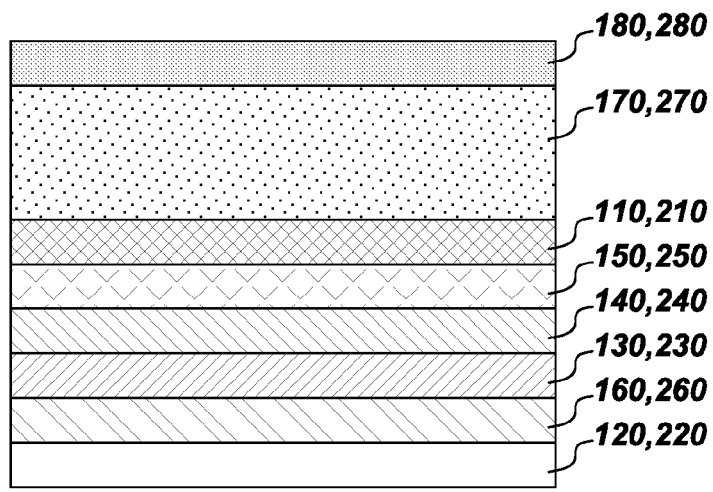

The thickness of the transparent conductive layers 130, 230 may be controlled by varying one or more of the deposition process parameters. For example, the thickness of the transparent conductive oxide layers 130, 230 may be engineered to be in a range of about 50-600 nm, and more particularly, in a range of about 100-500 nm, and still more particularly, in a range from about 150-400 nm For processes in which the layers 130, 230 are annealed prior to the disposition and subsequent thermal processing of the semiconductor layers 110, 210, the assemblies 100, 200 may further optionally include reducing or "getter" layers 140, 240, as indicated in FIGS. 4, 7 and 8, for example. More particularly, getter layers 140, 240 may be employed to protect CTO layers 130, 230 during annealing, prior to depositing semiconductor layers 110, 210. For particular processes, the getter layers 140, 240 may be disposed on the respective CTO layers 130, 230 prior to annealing the respective CTO layer 130, 230, such that the respective getter layer 140, 240 is oxidized during the anneal, becoming an optically transparent metal oxide layer 140, 240. Example materials for the getter layer 140, 240 include, without limitation, tin, aluminum, nickel, tantalum, titanium, indium, vanadium, zirconium, zinc, indium oxide, tin oxide, and titanium oxide, and combinations or alloys thereof. Thus, after annealing, a tin layer 140, 240 would comprise a tin oxide layer (also indicated by reference numeral 140, 240), for example. The other materials would similarly be oxidized, rendering them optically transparent. For particular configurations, the getter layer comprises tin. For particular configurations, the getter layer 140, 240 is less than about 30 nm in thickness, and more particularly, has a thickness in a range of about 3-30 nm, and still more particularly has a thickness in a range of about 7-15 nm. In one non-limiting example, a ten nanometer (10 nm) thick tin layer 140, 240 may be disposed on a CTO layer 130, 230. However, the specific thickness selected for the getter layer 140, 240 will vary depending on the thickness of the respective CTO layer 130, 230. Beneficially, the getter layer 140, 240 serves as a "getter" layer in that it prevents oxygen from penetrating into the respective CTO layer 130, 230. However, for many process configurations, no getter layer will be employed.

For the configurations shown in FIGS. 5-8, the assemblies 100, 200 further optionally include resistive, transparent buffer layers 150, 250. For the configurations shown in FIGS. 5 and 6, the resistive, transparent buffer layer 150, 250 is disposed on the respective transparent conductive layer 130, 230. Example materials for the resistive, transparent buffer layer 150, 250 include zinc tin oxide, tin oxide, zinc oxide, gallium oxide, aluminum oxide, silicon oxide, and combinations thereof. For the arrangements shown in FIGS. 7 and 8, the resistive, transparent buffer layer 150, 250 is disposed on a getter layer 140, 240.

Figure 6:
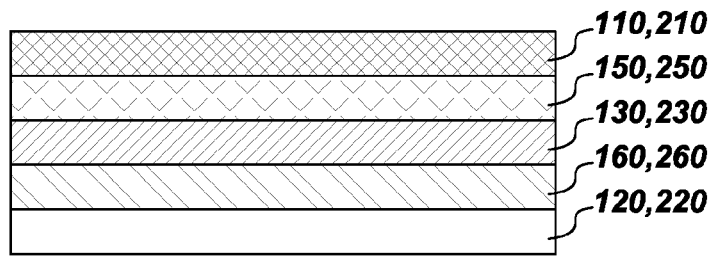

For the configurations shown in FIGS. 6-8, the assemblies 100, 200 further optionally include a barrier layer 160, 260 disposed between the respective support 120 and the respective transparent conductive layer 130, 230. Further, as indicated in FIGS. 7 and 8, there may be intervening layers between respective ones of these layers. Non-limiting example materials for the barrier layer include silicon dioxide ($SiO_2$), trisilicon tetranitride ($Si_3N_4$), aluminum oxide ($Al_2O_3$), silicon oxynitride ($SiO_xN_y$), as well as multilayer structures, such as $SiO_2/Si_3N_4$. Further, $SiO_2$ and $Si_3N_4$ materials doped with $Al_2O_3$ or Al may be employed as barrier layer materials.

For the arrangements shown in FIGS. 1, 2 and 7, the first and second semiconductor assemblies 100, 200 have the same layer structure. More particularly, the first and second semiconductor assemblies 100, 200 may have the same layer structure and the first and second semiconductor layers 110, 210 may comprise the same material. For example, each of the assemblies 100, 200 may include barrier 160, 260 and transparent conductive layer 130, 230 disposed between the respective support and semiconductor layer 110, 210. For other configurations (not expressly shown), the first and second semiconductor assemblies 100, 200 may have different layer structures. For example, one of the assemblies 100, 200 may consist only of a CdS (or CdS:O) layer on glass, while the other assembly 200, 100 may additionally include barrier and transparent conductive layers. However, even for configurations for which the two assemblies have different layer structures, the two opposing layers for the thermal processing will still be the semiconductor layers 110, 210.

EXAMPLE 1

Figure 9:
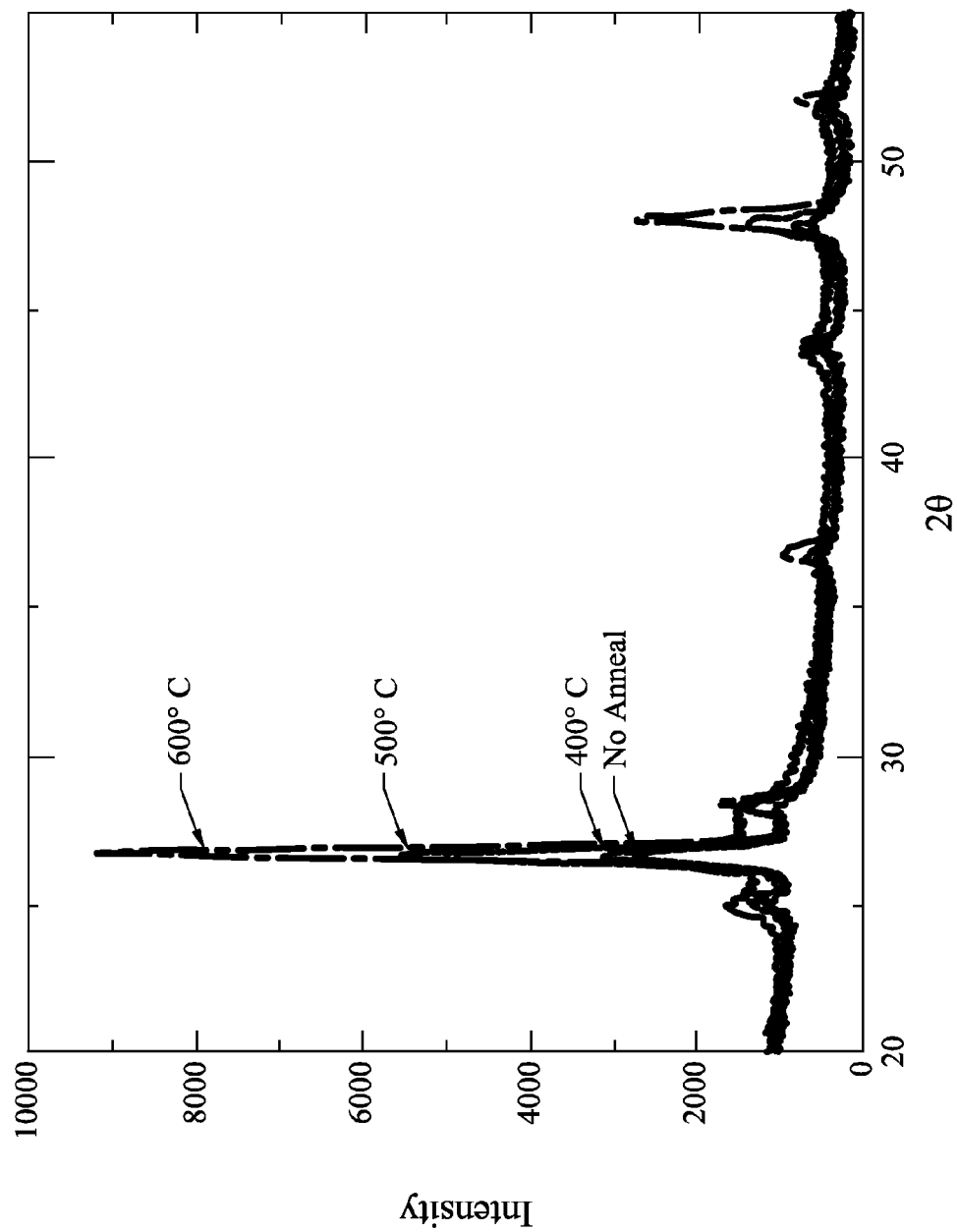
FIG. 9 is a plot of grazing incidence x-ray diffraction intensity as a function of incident angle for three annealed samples and one sample which was not annealed.

To evaluate the effect of performing face-to-face annealing on oxygenated CdS, face-to-face anneals were performed with CdS layers 210 and oxygenated CdS layers 110 (CdS:O (5% O)). The anneals were performed at 400° C., 500° C., and 600° C. for 15 minutes at 200 Ton in a nitrogen environment. The resulting annealed CdS:O (5% O) samples were then inspected using grazing incidence x-ray diffraction, and a plot of the intensities versus the diffraction angle 2θ is shown in FIG. 9. As indicated in FIG. 9, the diffraction peaks are sharpest for the 600° C. annealed sample and the weakest for the sample that was not annealed, which indicated that the grain size increases with the anneal temperature, over the range of temperatures used.

EXAMPLE 2

Figure 10:
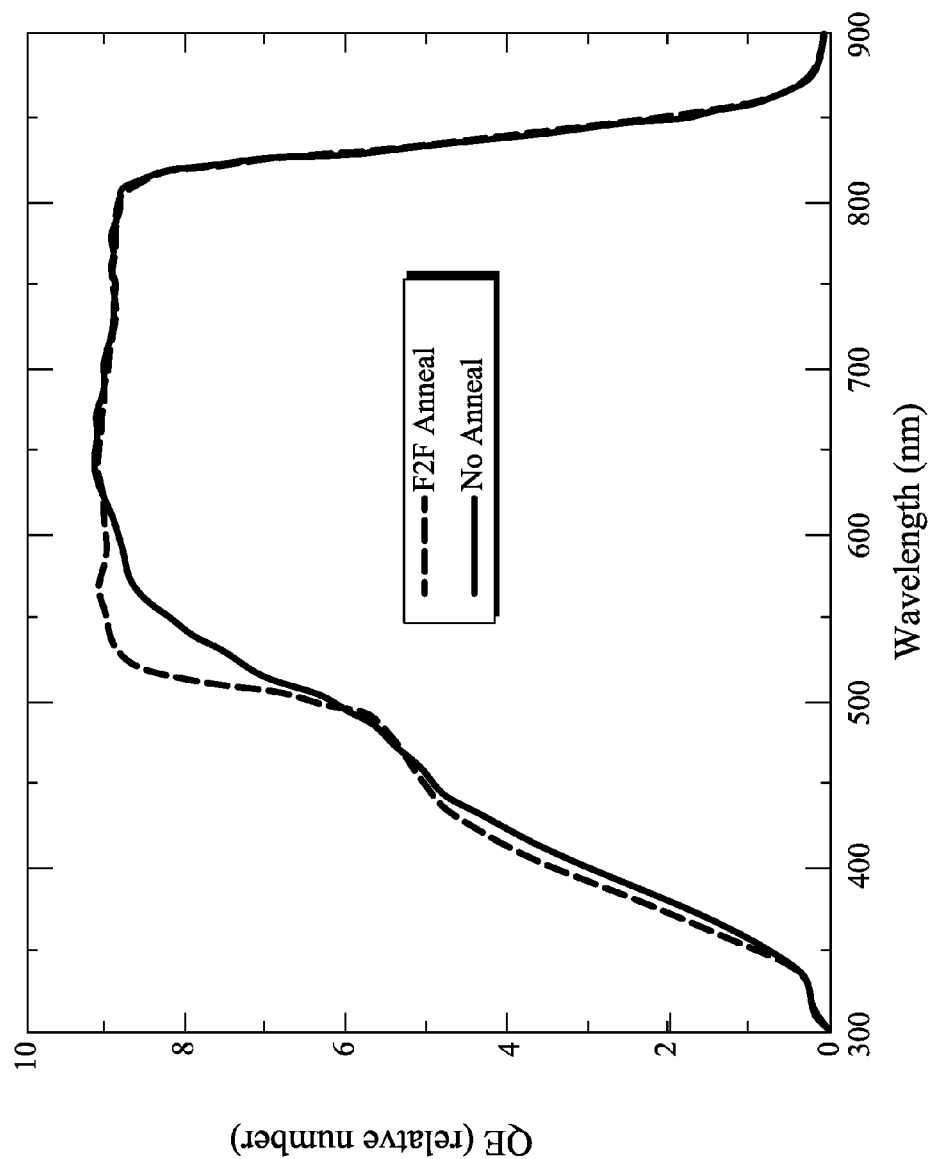
FIG. 10 is a plot of external quantum efficiency as a function of wavelength for face-to-face annealed and un-annealed oxygenated CdS samples.
Figure 11:
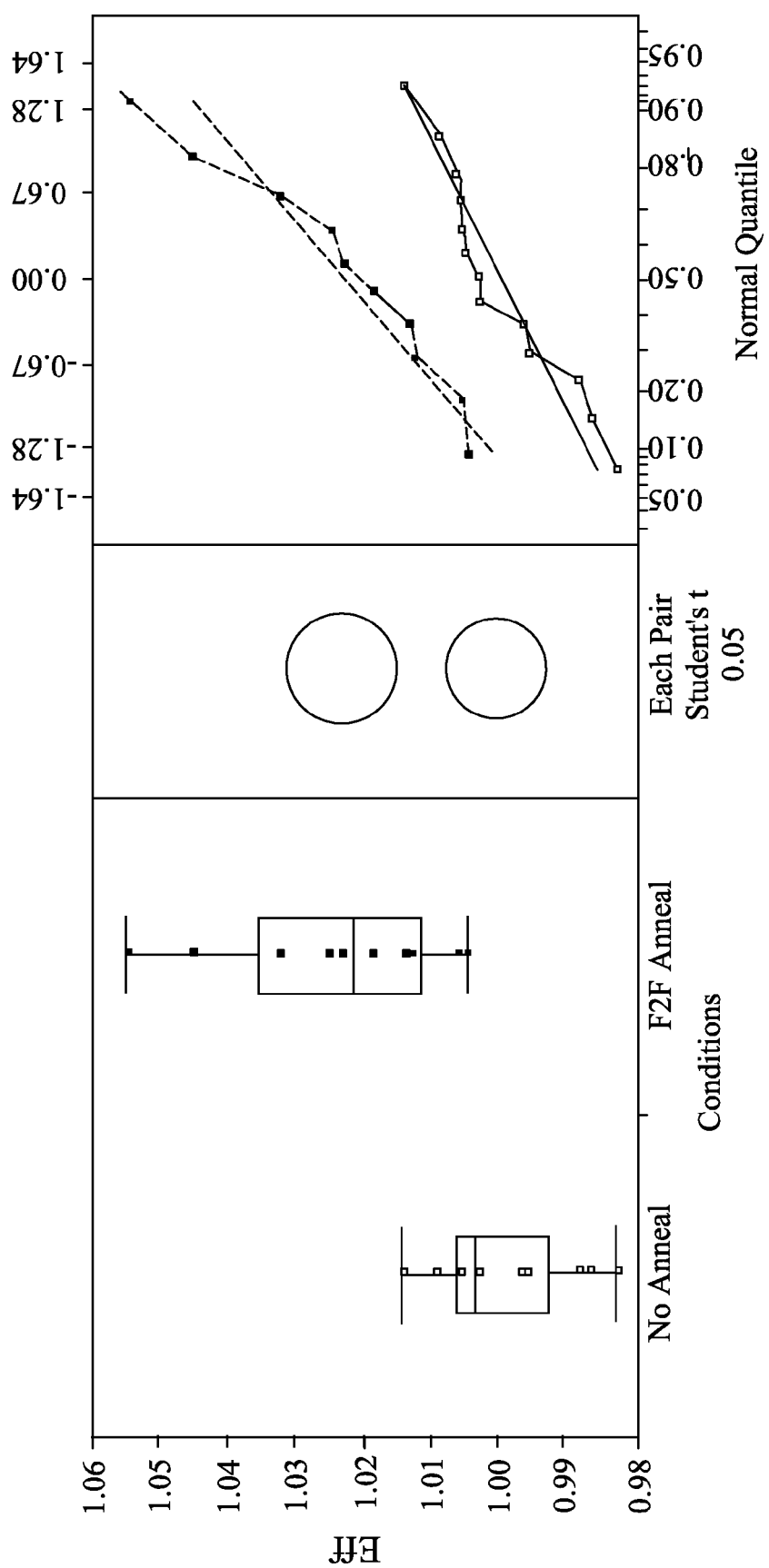
FIG. 11 is a box plot of the cell efficiencies using CdS that either underwent a face-to-face anneal or was not annealed.
Figure 12:
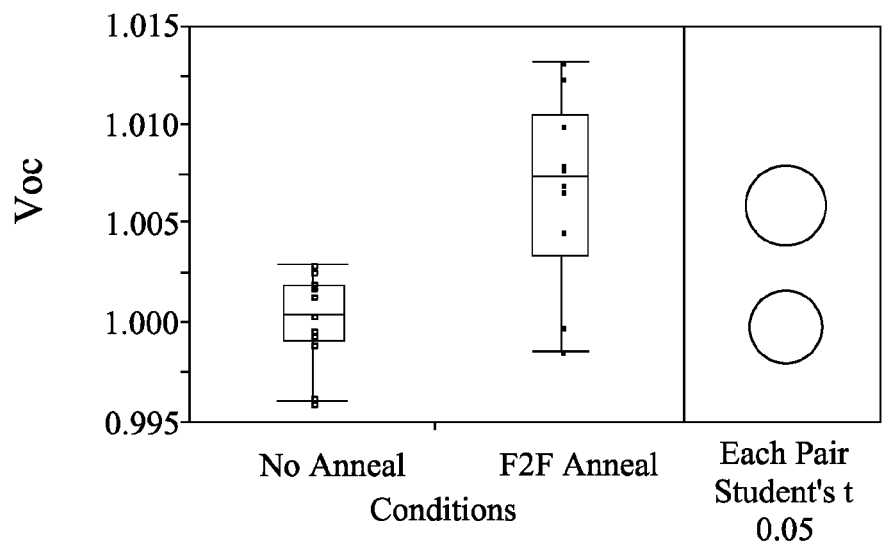
FIG. 12 is a box plot of the open circuit voltage $V_{OC}$ using CdS that either underwent a face-to-face anneal or was not annealed.
Figure 13:
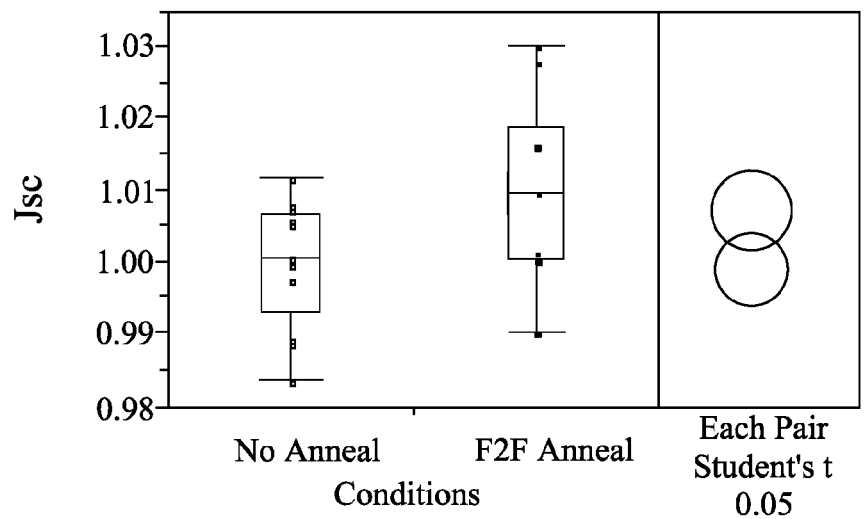
FIG. 13 is a box plot of the short circuit current $J_{SC}$ using CdS that either underwent a face-to-face anneal or was not annealed.
Figure 14:
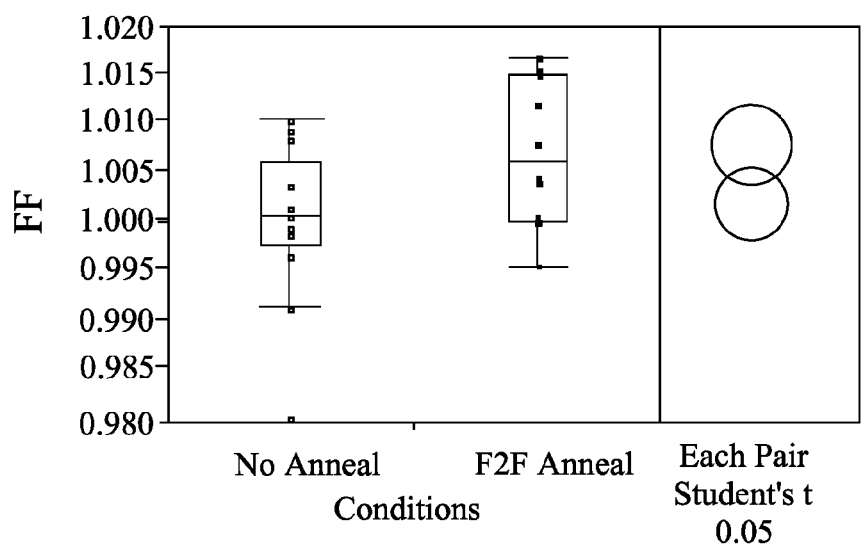
FIG. 14 is a box plot of the fill factor FF using CdS that either underwent a face-to-face anneal or was not annealed.

To further evaluate the effect of performing face-to-face annealing on oxygenated CdS, a face-to-face anneal was performed with oxygenated CdS layers 210 (CdS:O (5% O)) and oxygenated CdS layers 110 (CdS:O (5% O)). The anneal was performed at 600° C. for 15 minutes at 200 Ton in a nitrogen environment. FIG. 10 shows the external quantum efficiency for the resulting annealed CdS:O (5% O) sample as well as that for an un-annealed sample. As shown in FIG. 10, the quantum efficiency for the annealed sample is higher than that of the un-annealed sample. FIG. 11 shows that the cell efficiencies for the cells having face-to-face annealed CdS exceeded those of cells with CdS that was not annealed. Similarly, FIGS. 12, 13 and 14 show that each of the open circuit voltage $V_{OC}$, short circuit current $J_{SC}$, and fill factor FF, increase for the cells with the face-to-face annealed CdS relative to cells with un-annealed CdS.

Beneficially, by thermally processing CdS layers 110, 210 in a face-to-face arrangement, the vapor pressure of CdS can be maintained near the surface of the two CdS films 110, 210, and thus the CdS sublimation can be reduced. Thus, the above face-to-face thermal processing facilitates processing CdS films 110, 210 at higher temperatures. These relatively high temperature thermal anneals may better recrystallize the CdS films. Without being bound by a particular theory, it is believed that the above-described thermal processing may modify the microstructure and optical transmission of CdS films 110, 210, as well as modifying the interface between the CdS and the subsequently deposited CdTe (absorber) layers. As discussed above with reference to FIGS. 9-14, the thermally processed semiconductor layers 110, 210, may lead to relatively high efficiency cells, with relatively high short circuit current, open circuit voltage, and/or fill factor.

Although only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of manufacturing a plurality of semiconductor assemblies, the manufacturing method comprising:
   thermally processing a first semiconductor assembly comprising a first semiconductor layer disposed on a first support; and
   thermally processing a second semiconductor assembly comprising a second semiconductor layer disposed on a second support,
   wherein the first and second semiconductor assemblies are thermally processed simultaneously, and wherein the first and second semiconductor assemblies are arranged such that the first semiconductor layer faces the second semiconductor layer during the thermal processing, and
   wherein the first and the second semiconductor layers comprise a material selected from the group consisting of cadmium sulfide (CdS), indium (III) sulfide ($In_2S_3$), zinc sulfide (ZnS), zinc telluride (ZnTe), zinc selenide (ZnSe), cadmium selenide (CdSe), cadmium manganese selenide ($Cd_xMn_{1-x}Se$), oxygenated cadmium sulfide (CdS:O), copper oxide ($Cu_2O$), amorphous or micro-crystalline silicon and Zn(O,H) and combinations thereof.

2. The manufacturing method of claim 1, wherein the first and second semiconductor assemblies are arranged such that the first and the second semiconductor layers are adjacent during the thermal processing.

3. The manufacturing method of claim 1, wherein the first and second semiconductor assemblies are arranged such that the first and the second semiconductor layers are spaced apart from one another during the thermal processing, wherein the first and the second semiconductor layers comprise a material, and wherein the thermal processing is performed with an overpressure of vapor phase of the material, of the constituents of the material, or combinations thereof.

4. The manufacturing method of claim 3, wherein the first and second semiconductor assemblies are spaced apart from one another by a maximum distance of about 2mm during the thermal processing.

5. The manufacturing method of claim 4, wherein the first and second semiconductor assemblies are spaced apart from one another by a maximum distance of about 0.7 mm during the thermal processing.

6. The manufacturing method of claim 3, further comprising disposing at least one spacer between the first and the second semiconductor layers, such that the first and the second semiconductor layers are spaced apart from one another during the thermal processing.

7. The manufacturing method of claim 6, wherein the at least one spacer comprises a particulate material disposed on at least a portion of the first semiconductor layer, on at least a portion of the second semiconductor later, or on at least a portion of both the first and the second semiconductor layers.

8. The manufacturing method of claim 7, wherein the first and the second semiconductor layers comprise a metallic elemental constituent, and wherein the particulate material comprises the metallic elemental constituent.

9. The manufacturing method of claim 8, wherein the particulate material further comprises a reducing agent.

10. The manufacturing method of claim 8, wherein the metallic elemental constituent comprises cadmium.

11. The manufacturing method of claim 8, wherein the first and the second semiconductor layers further comprise sulfur, and wherein the particulate material comprises sulfur.

12. The manufacturing method of claim 8, wherein the first and the second semiconductor layers comprise cadmium sulfide (CdS) or oxygenated cadmium sulfide (CdS:O), and wherein the particulate material comprises CdS or oxygenated cadmium sulfide (CdS:O).

13. The manufacturing method of claim 1, further comprising:
   disposing the first semiconductor layer on the first support; and
   disposing the second semiconductor layer on the second support, wherein the first and second semiconductor layers are disposed prior to performing the thermal processing.

14. The manufacturing method of claim 13, wherein the first and the second semiconductor layers are disposed using a low substrate temperature deposition technique.

15. The manufacturing method of claim 13, further comprising disposing at least one intermediate layer on the first support prior to disposing the first semiconductor layer, such that the at least one intermediate layer is disposed between the first support and the first semiconductor layer.

16. The manufacturing method of claim 13, further comprising disposing at least one intermediate layer on the second support prior to disposing the second semiconductor layer, such that the at least one intermediate layer is disposed between the second support and the second semiconductor layer.

17. The manufacturing method of claim 13, further comprising:
   disposing at least one intermediate layer on the first support prior to disposing the first semiconductor layer, such that the at least one intermediate layer is disposed between the first support and the first semiconductor layer; and
   disposing at least one intermediate layer on the second support prior to disposing the second semiconductor layer, such that the at least one intermediate layer is disposed between the second support and the second semiconductor layer.

18. The manufacturing method of claim 1, wherein the first and second semiconductor assemblies have the same layer structure.

19. The manufacturing method of claim 1, wherein the first and second semiconductor assemblies have different layer structures, and wherein the first and second semiconductor layers comprise the same material.

20. The manufacturing method of claim 1, wherein the thermal processing comprises heating the first and second semiconductor layers at temperatures in a range of about 500° C. to about 700° C.

21. The manufacturing method of claim 20, wherein the thermal processing comprises heating the first and second semiconductor layers at temperatures in a range of about 550° C. to about 660° C.

22. The manufacturing method of claim 1, wherein the thermal processing takes about 1-40 minutes to complete.

23. The manufacturing method of claim 1, wherein the first and the second semiconductor layers comprise a metal-selenide or a metal-sulfide.

24. The manufacturing method of claim 23, wherein the first and the second semiconductor layers comprise a material selected from the group consisting of cadmium sulfide (CdS), indium (III) sulfide ($In_2S_3$), zinc sulfide (ZnS), zinc selenide (ZnSe), cadmium selenide (CdSe), cadmium manganese selenide ($Cd_xMn_{1-x}Se$), oxygenated cadmium sulfide (CdS:O), and combinations thereof.

25. The manufacturing method of claim 24, wherein the first and the second semiconductor layers comprise cadmium sulfide (CdS) or oxygenated cadmium sulfide (CdS:O).

26. The manufacturing method of claim 25, wherein the first and the second semiconductor layers comprise oxygenated cadmium sulfide (CdS:O) with an oxygen content in a range of about two atomic percent (2%) to about twenty five atomic percent (25%).

27. A method of manufacturing a plurality of semiconductor assemblies, the manufacturing method comprising:
simultaneously thermally processing a first semiconductor assembly comprising a first semiconductor layer disposed on a first support and a second semiconductor assembly comprising a second semiconductor layer disposed on a second support, the first and second semiconductor assemblies being arranged such that the first semiconductor layer faces the second semiconductor layer during the thermal processing,
wherein the first and the second semiconductor layers comprise a material, and wherein the thermal processing is performed with an overpressure of vapor phase of the material, of the constituents of the material, or combinations thereof; and
wherein a particulate material is disposed on at least one of the first and second semiconductor layers as a spacer between the first and second semiconductor layers during thermal processing.

* * * * *